United States Patent
Misaki

(10) Patent No.: US 8,493,165 B2
(45) Date of Patent: Jul. 23, 2013

(54) ELECTRIC JUNCTION BOX AND CURRENT DETECTION DEVICE

(75) Inventor: Takashi Misaki, Yokkaichi (JP)

(73) Assignees: Autonetworks Technology Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/501,192

(22) PCT Filed: Oct. 21, 2010

(86) PCT No.: PCT/JP2010/068562
§ 371 (c)(1),
(2), (4) Date: Apr. 10, 2012

(87) PCT Pub. No.: WO2011/049161
PCT Pub. Date: Apr. 28, 2011

(65) Prior Publication Data
US 2012/0206225 A1    Aug. 16, 2012

(30) Foreign Application Priority Data
Oct. 22, 2009  (JP) ................................. 2009-243776

(51) Int. Cl.
*H01F 7/00*  (2006.01)
(52) U.S. Cl.
USPC .................... 335/219; 439/76.2; 338/32 H
(58) Field of Classification Search
USPC .......................................................... 335/219
See application file for complete search history.

(56) References Cited

U.S. PATENT DOCUMENTS

| | | | | |
|---|---|---|---|---|
| 5,831,425 | A  * | 11/1998 | Ochiai | 324/117 R |
| 6,515,468 | B1 * | 2/2003 | Morimoto et al. | 324/117 H |
| 6,646,429 | B2 * | 11/2003 | Gohara et al. | 324/117 H |
| 7,148,675 | B2 * | 12/2006 | Itoh | 324/117 R |
| 7,205,757 | B2 * | 4/2007 | Itoh et al. | 324/117 R |
| 7,316,576 | B2 * | 1/2008 | Saito et al. | 439/76.2 |
| 7,663,358 | B2 * | 2/2010 | Hashio et al. | 324/117 R |
| 7,671,608 | B2 * | 3/2010 | Oda | 324/724 |
| 2005/0237050 | A1 * | 10/2005 | Itoh | 324/117 R |
| 2006/0043960 | A1 * | 3/2006 | Itoh et al. | 324/117 R |
| 2006/0119343 | A1 * | 6/2006 | Saito et al. | 324/117 H |
| 2008/0186021 | A1 * | 8/2008 | Hashio et al. | 324/225 |
| 2012/0212220 | A1 * | 8/2012 | Fukuyama | 324/253 |

FOREIGN PATENT DOCUMENTS

| | | |
|---|---|---|
| JP | A-2002-243768 | 8/2002 |
| JP | A-2002-318251 | 10/2002 |
| JP | A-2005-332851 | 12/2005 |

OTHER PUBLICATIONS

Jan. 25, 2011 International Search Report issued in International Patent Application No. PCT/JP2010/068562.
Jan. 25, 2011 Written Opinion of the International Searching Authority issued in International Patent Application No. PCT/JP2010/068562.

* cited by examiner

*Primary Examiner* — Elvin G Enad
*Assistant Examiner* — Lisa Homza
(74) *Attorney, Agent, or Firm* — Oliff & Berridge, PLC

(57) ABSTRACT

An electric junction box includes a current detection device. The current detection device has a magneto-electric conversion element and a magnetic core having a disposing space in which this magneto-electric conversion element is disposed, to detect magnetic flux occurring on the magnetic core as a current. The magnetic core has a bus bar insertion space through which a bus bar from which the current is to be detected is inserted, which bus bar has an insertion portion which is formed not to be larger than a width size of the disposing space in the magnetic core and to be inserted into the disposing space.

6 Claims, 11 Drawing Sheets

ELECTRIC JUNCTION BOX AND CURRENT DETECTION DEVICE

TECHNICAL FIELD

The present invention relates to an electric junction box and a current detection device.

BACKGROUND ART

An electric junction box which is mounted on a vehicle etc, includes a current detection device in some cases (see, for example, Patent Document 1). Patent Document 1 describes a current detection device whose case houses a magnetic core, a bus bar which is inserted through an insertion portion in the magnetic core so that a current flowing through the bus bar may be detected, and a magneto-electric conversion element which is disposed in a disposing space in the magnetic core to detect the intensity of a magnetic field occurring due to the current flowing through the bus bar.

Patent Document 1: Japanese Patent Application Laid-Open No. 2002-243768

The size of the bus bar attached to the electric junction box is determined by the amount of a current flowing through the bus bar. That is, if the current flowing through the bus bar increases, it becomes necessary to increase the size of the bus bar by, for example, increasing its width and thickness.

To assemble the current detection device, the bus bar must be inserted through the insertion portion in the magnetic core, so that as the bus bar size increases, the magnetic core needs to have the larger insertion portion. Therefore, there occurs a problem in that an increase in size of the insertion portion in the magnetic core leads to an increase in size of the magnetic core itself, consequently leading to an increase in size of the current detection device and the electric junction box.

Therefore there is a need in the art to decrease the sizes of the current detection device and the electric junction box.

SUMMARY

The present invention provides an electric junction box including a current detection device and a bus bar. The current detection device has a magneto-electric conversion element and a magnetic core including a disposing space in which the magneto-electric conversion element is disposed, to detect magnetic flux occurring on the magnetic core as a current. The magnetic core has a bus bar insertion space through which a bus from which the current is to be detected is inserted. The bus bar includes an insertion portion that is to be inserted through the disposing space and is formed not larger than a width size of the disposing space in the magnetic core.

Further, the present invention provides a current detection device having a magneto-electric conversion element and a magnetic core including a disposing space in which the magneto-electric conversion element is disposed, to detect magnetic flux occurring on the magnetic core as a current. The magnetic core has a bus bar insertion space through which a bus bar is inserted and from which the current is to be detected and the bus bar includes an insertion portion is formed not larger than a width size of the disposing space in the magnetic core and is to be inserted through the disposing space.

In the present invention, to assemble the magnetic core to the bus bar, first the disposing space in the magnetic core is inserted to the insertion portion of the bus bar. According to the present invention, the insertion portion of the bus bar has a width size not larger than the width size of the disposing space and, therefore, can smoothly pass through the disposing space in the magnetic core.

Next, the magnetic core is further moved to dispose the bus bar to the bus bar insertion space in the magnetic core, so that the magnetic core is attached to the bus bar. Typically, the width size of the disposing space in the magnetic core is smaller in size than an inner diameter of the bus bar insertion space, so that the insertion portion of the bus bar can easily be moved to the bus bar insertion space in the magnetic core.

Therefore, according to the present invention, the bus bar includes the insertion portion that can smoothly pass through the disposing space in the magnetic core, so that even if the bus bar increases in size as a whole, it is unnecessary to enlarge the bus bar insertion space in the magnetic core. As a result, according to the present invention, the magnetic core can be decreased in size, thereby miniaturizing the current detection device and the electric junction box.

Further, according to the present invention, the bus bar, which has been used as a conductor conventionally, only needs to be machined, so that no conductor needs to be made of any other materials, thereby reducing the costs.

As may be seen from the above, according to the present invention, it is possible to miniaturize the electric junction box and the current detection device.

EXPLANATION OF SYMBOLS

Figure 1:
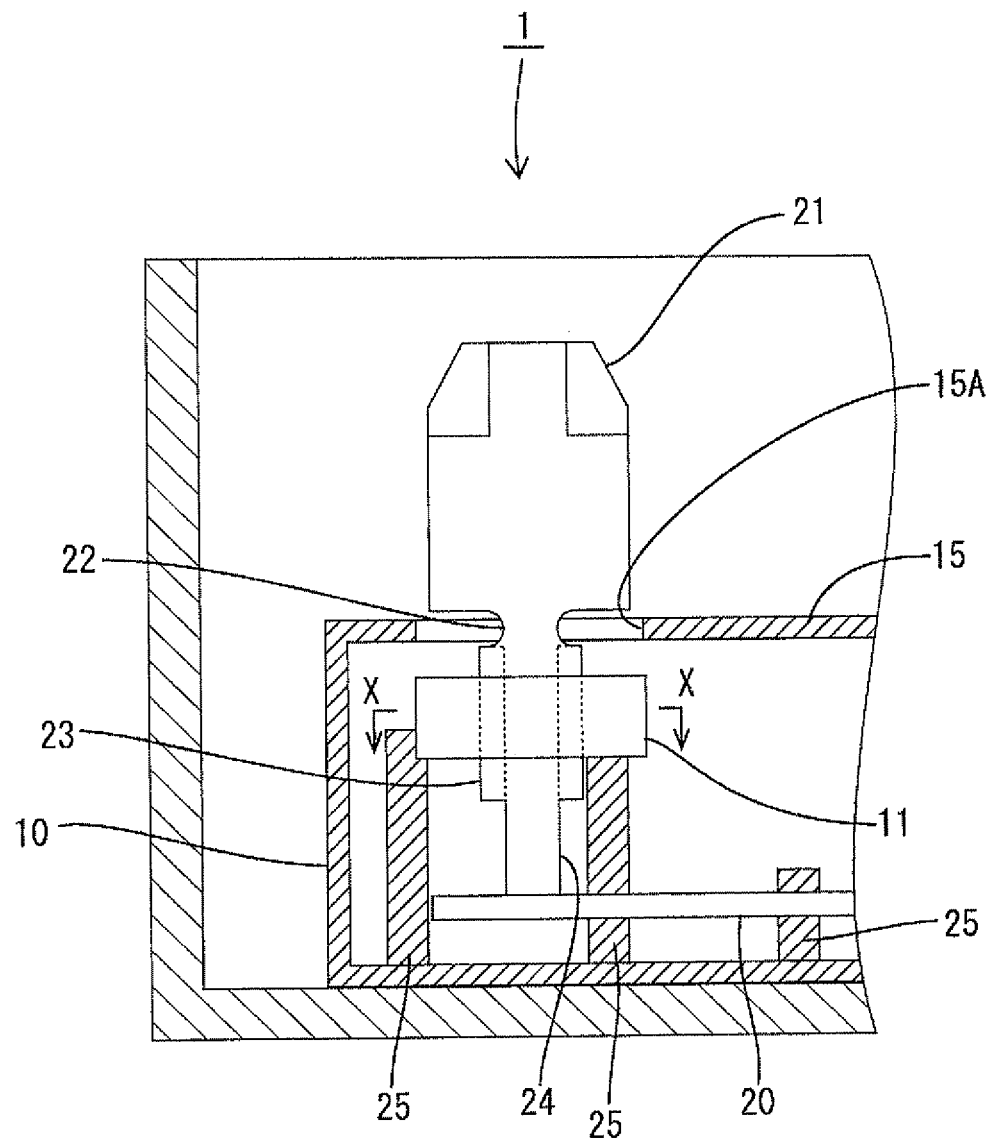
FIG. 1 is a partial cross-sectional view of an electric junction box of a first embodiment.

1: Electric junction box
10: Current detection device
11: Magnetic core
12: Disposing space
13: Bus bar insertion space
14: Magneto-electric conversion element
20: Bus bar
21: Terminal portion
23: Wide portion
24: Constricted portion (insertion portion)
24A: Insertion portion
25: Rib portion
26: Lock portion 27: Bus bar body portion
A: Width size (of disposing space)
B: Thickness size (of disposing space)
C: Length (of constricted portion)

BEST MODE FOR CARRYING OUT THE
INVENTION

First Embodiment

A description will be given of a first embodiment of the present invention with reference to FIGS. 1 through 5. An electric junction box 1 of the present embodiment includes a current detection device 10 that detects a current flowing through a bus bar 20. A magnetic core 11, a magneto-electric conversion element 14 that detects magnetic flux, and the bus bar 20 are housed in a case 15 of the current detection device 10 (see FIGS. 1 and 2).

The case 15 of the current detection device 10 is formed like a box as shown in FIG. 1, in which the bus bar 20 projects from an insertion hole 15A formed at an upper portion of the case 15.

Figure 2:
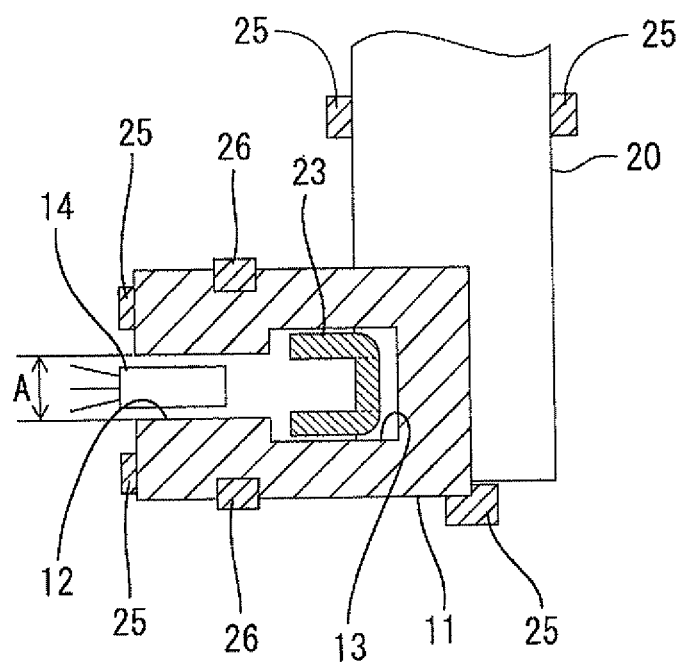
FIG. 2 is a partial cross-sectional view taken along line X-X of FIG. 1.

As shown in FIG. 2, the magnetic core 11 is roughly C-shaped and includes a disposing space 12 where the magneto-electric conversion element 14 that detects magnetic flux is disposed and a bus bar insertion space 13 through which the bus bar 20 is inserted.

Figure 3:
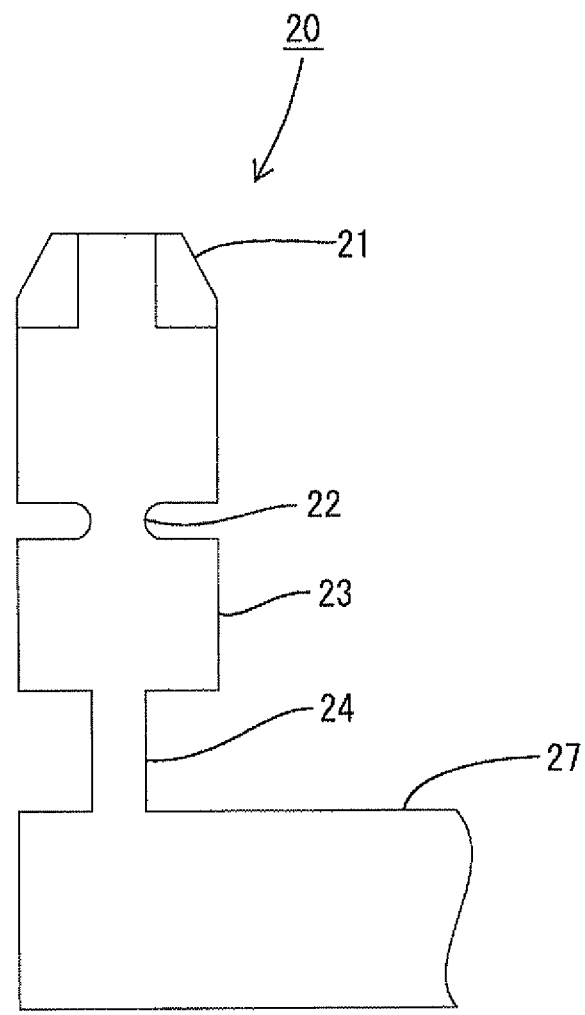
FIG. 3 is a partially developed view of a bus bar.

The bus bar 20 is made of a conductive material such as copper and has a developed shape as shown in FIG. 3. The bus bar 20 has on its top a terminal portion 21 which is connected to any other member (not shown) such as a battery or an inverter. The size of the terminal portion 21 is determined by the amount of a current flowing through the bus bar 20.

As shown in FIG. 3, below the terminal portion 21, a neck portion 22 having a smaller width size than the terminal portion 21, a wide portion 23 having a square-shape and roughly the same width as the terminal portion 21, and a strip-shaped portion 24 having a smaller width size are sequentially connected in this order.

Figure 4:
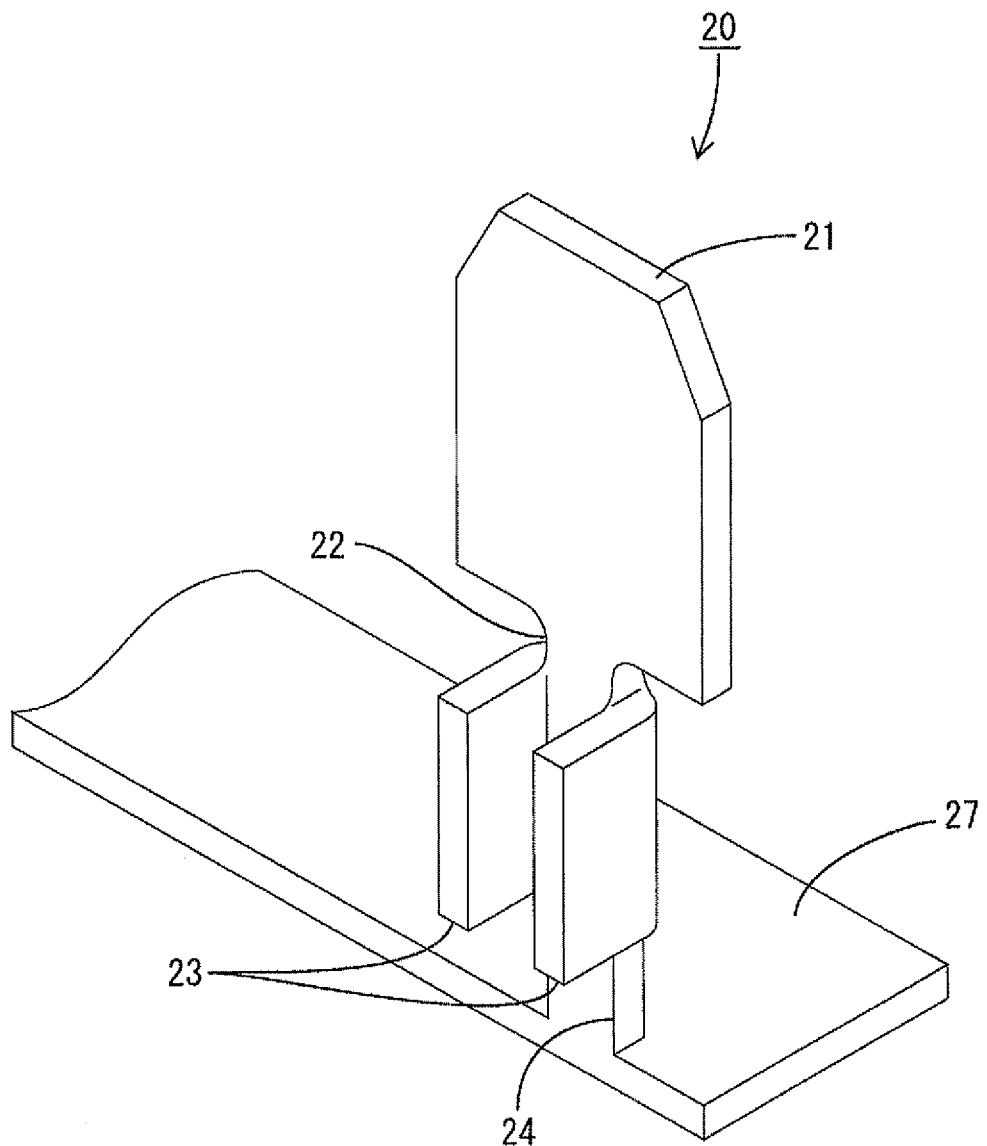
FIG. 4 is a partial perspective view of the bus bar.

As shown in FIG. 4, the wide portion 23 adjacent to the neck portion 22 is bent to a U-shape to provide a portion to be inserted through the bus bar insertion space 13 in the magnetic core 11. The wide portion 23 is formed wider than the strip-shaped portion 24. As shown in FIG. 4, the wide portion 23 is formed roughly perpendicular to a bus bar body portion 27. The cross-sectional area of the wide portion 23 is preferably almost the same as that of the bus bar body portion 27 in order to improve the forming yield of the bus bar.

The constricted portion 24 adjacent to the wide portion 23 is formed so that its width size is not larger than a width size A of the disposing space 12 in the magnetic core 11 (see FIG. 2) and its length C is at least a thickness size B of the magnetic core 11 (see FIG. 5) and, therefore, can be inserted smoothly into the disposing space 12 in the magnetic core 11. The constricted portion 24 corresponds to the insertion portion In the present embodiment, a length C of the constricted portion 24 is set slightly larger than the thickness size B of the magnetic core 11, that is, to a minimum length required to assemble the magnetic core 11.

Next, a description will be briefly given of a method of assembling the current detection device 10 to the electric junction box 1.

A predetermined shape (see FIG. 3) of the bus bar 20 is cut out of a conductive metal plate and subjected to bending etc, to provide a shape such as shown in FIGS. 2 and 4. Specifically, the wide portion 23 of the bus bar 20 is formed into a U-shape through machining to provide a shape such that it can be inserted into the bus bar insertion space 13 in the magnetic core 11.

Figure 5:
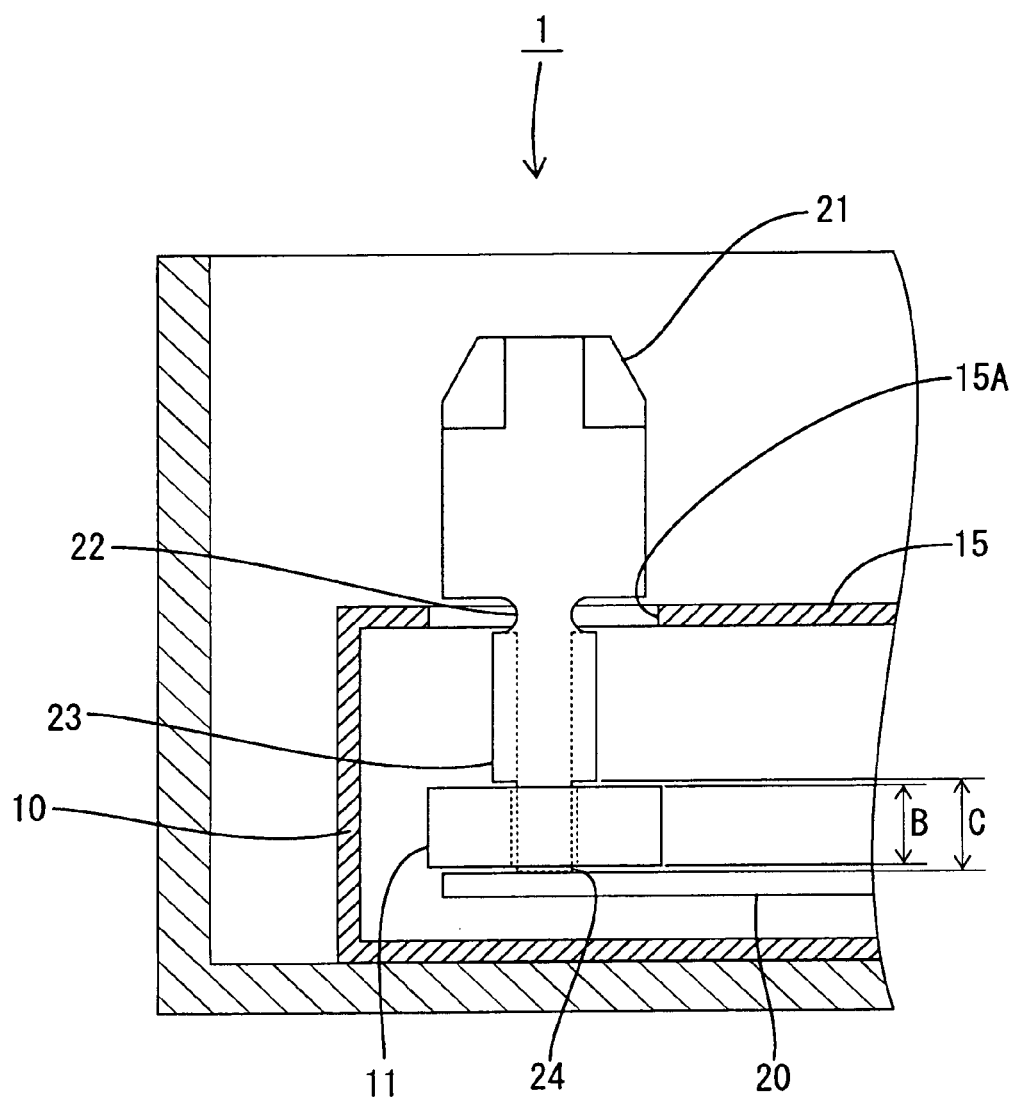
FIG. 5 is an explanatory partial cross-sectional view of a state in which a magnetic core is attached to a constricted portion of the bus bar.

To the bus bar 20 made in such a manner, the magnetic core 11 is assembled according to the following procedure. First, as shown in FIG. 5, the constricted portion 24 of the bus bar 20 is inserted into the disposing space 12 in the magnetic core 11. In the present embodiment, the constricted portion 24 of the bus bar 20 is formed so that its width size is not larger than the width size A of the disposing space 12 in the magnetic core 11 and its length C is at least the thickness size B of the magnetic core 11 and, therefore, can be inserted into smoothly the disposing space 12 in the magnetic core 11. In other words, the constricted portion 24 is inserted through the disposing space 12.

Next, the bus bar 20 or the magnetic core 11 is moved so that the bus bar insertion space 13 in the magnetic core 11 is disposed to the wide portion 23 of the bus bar 20. At this point in time, the wide portion 23 is already U-shaped through machining so that it can be inserted into the bus bar insertion space 13 in the magnetic core 11 and, therefore, can be inserted through the bus bar insertion space 13.

The bus bar 20 inserted into the magnetic core 11 and the magnetic core 11 are held by the respective rib 25 and lock portion 26 formed on the case 15 of the current detection device so that they do not come into contact with each other.

The bus bar 20 fitted with the magnetic core 11 in such a manner is disposed to a predetermined position on the case 15, to then attach the magneto-electric conversion element 14 in the disposing space 12 in the magnetic core 11. Next, the case fitted with the bus bar 20 is disposed to a predetermined position on the electric junction box 1, thereby assembling the current detection device 10 to the electric junction box 1.

Next, a description will be given of effects of the present embodiment. In the present embodiment, the bus bar 20 includes the constricted portion 24 configured to be inserted smoothly into the disposing space 12 in the magnetic core 11 and the wide portion 23 configured to be inserted through the magnetic core, so that even if the bus bar 20 is enlarged as a whole, the bus bar insertion space 13 in the magnetic core 11 need not be enlarged. As a result, according to the present embodiment, it is possible to miniaturize the magnetic core 11 and, consequently, the current detection device 10. By miniaturizing the current detection device 10, it is possible to miniaturize the electric junction box 1 including the current detection device 10.

When the bus bar 20 includes a portion having a smaller width size, the bus bar 20 may possibly have a larger resistance value. However, according to the present embodiment, the constricted portion 24 has a length C set to a minimum value required to attach the magnetic core 11 and has the wide portion 23 adjacent to the constricted portion 24, so that it is possible to attach the magnetic core 11 while securely preventing an increase in resistance value of the bus bar 20.

Furthermore, according to the present embodiment, only by machining the bus bar 20 conventionally used as a conductor, the current detection device 10 can be miniaturized to eliminate the need for manufacturing the conductor of any other material, thereby reducing the costs.

Other Embodiment

The present invention is not limited to the embodiment described above with reference to the drawings and may include, for example, the following embodiments in its technical scope.

(1) Although in the above embodiment, the constricted portion 24 has been described to be formed to have the minimum length required to pass through the magnetic core 11, the length of the constricted portion 24 may be longer than that described in the embodiment.

Figure 6:
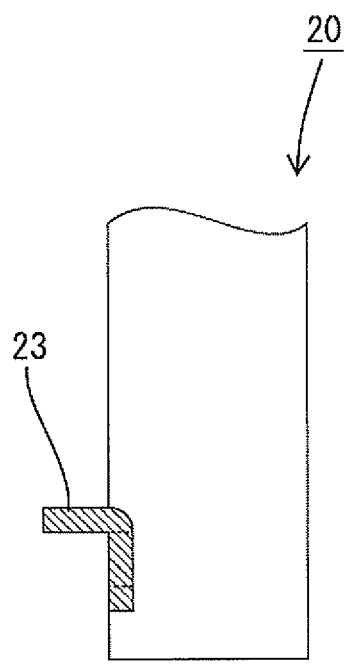
FIG. 6 is a partial cross-sectional view of a bus bar described in a second embodiment.
Figure 7:
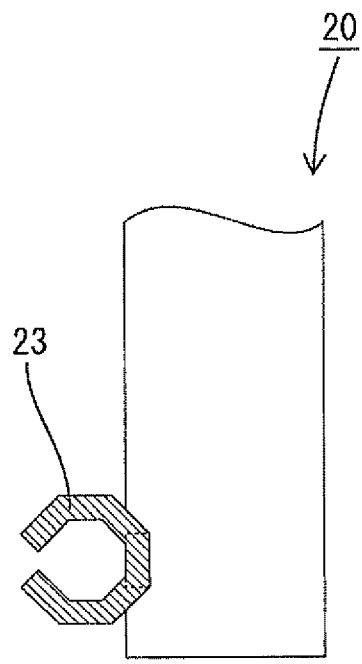
FIG. 7 is another partial cross-sectional view of the bus bar described in the second embodiment.

(2) Although in the above embodiment, the bus bar 20 has been described to have the wide portion 23 bent into the U-shape, the wide portion 23 may be bent into an L-shape as shown in FIG. 6. Further, the wide portion 23 may be bent into an octagonal shape as shown in FIG. 7 or any other given polygonal shape such as a triangular shape.

Figure 8:
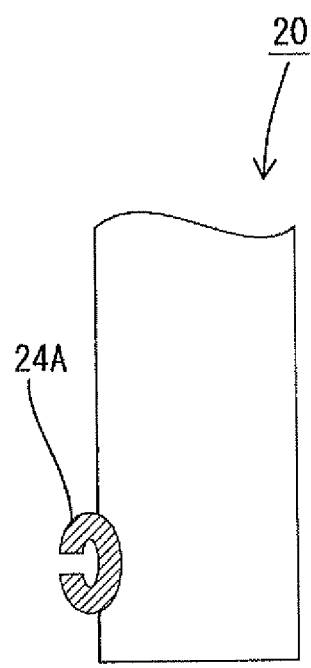
FIG. 8 is a partial cross-sectional view of a bus bar described in a third embodiment.
Figure 9:
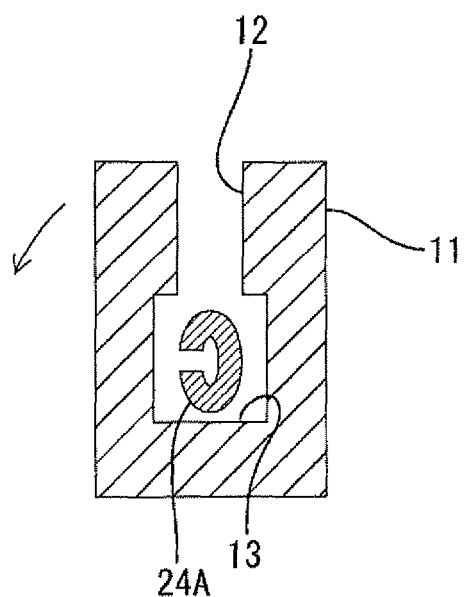
FIG. 9 is an explanatory partial cross-sectional view illustrating a procedure for attaching the magnetic core to the bus bar in the third embodiment.
Figure 10:
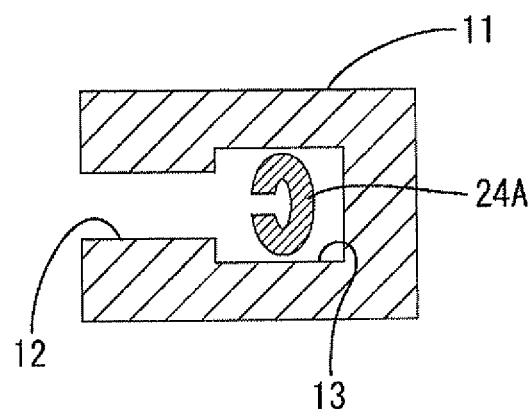
FIG. 10 is another explanatory partial cross-sectional view illustrating the procedure for attaching the magnetic core to the bus bar in the third embodiment.

(3) Although in the above embodiment, the constricted portion 24 has been described as the insertion portion, an insertion portion 24A which can be inserted through the disposing space 12 may be made by bending the bus bar into a shape having a size not larger than the width size of the disposing space 12 in the magnetic core as shown in FIG. 8. With this configuration, it is possible to insert the insertion portion 24A to the disposing space 12 in the magnetic core 11 as shown in FIG. 9 and turn the magnetic core 11 as shown by the arrow illustrated in FIG. 9, thereby attaching the magnetic core 11 to the bus bar 20 easily as shown in FIG. 10. According to this embodiment, it is unnecessary to give the constricted portion 24 having the small width size to the bus bar 20, so that an increase in electrical resistance can be suppressed.

Figure 11:
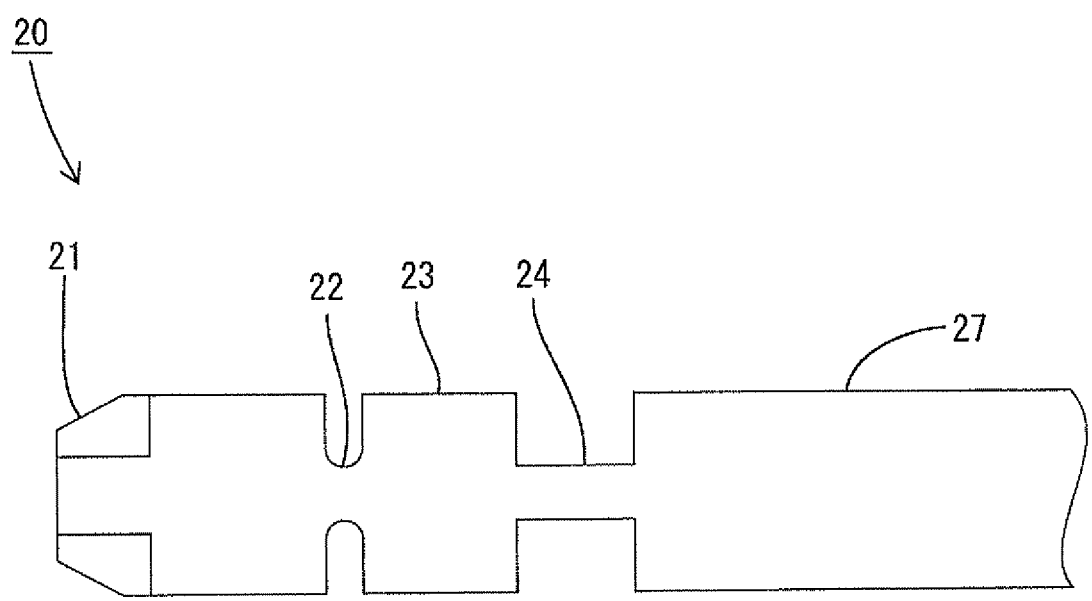
FIG. 11 is a partially developed view of a bus bar described in a fourth embodiment.

(4) Although in the above embodiment, the wide portion 23 has been described to be roughly perpendicular to the bus bar body portion 27 as shown in FIG. 4, the wide portion 23 may be formed rectilinearly to the bus bar body portion 27 as shown in FIG. 11. In FIG. 11, numeral 20 denotes the bus bar, numeral 21 denotes the terminal portion, numeral 22 denotes the neck portion, numeral 23 denotes the wide portion, and numeral 24 denotes the constricted portion.

The present embodiment is the electric junction box including the current detection device. The current detection device has the magneto-electric conversion element and the magnetic core having the disposing space in which the magneto-electric conversion element is disposed, to detect magnetic flux occurring on the magnetic core as a current. The magnetic core has the bus bar insertion space through which the bus bar from which the current is to be detected is inserted. The bus bar includes the insertion portion which is formed not to be larger than the width size of the disposing space in the magnetic core and to be inserted into the disposing space.

In the present embodiment, to attach the magnetic core to the bus bar, first the insertion portion of the bus bar is inserted into the disposing space in the magnetic core. In the present embodiment, the insertion portion of the bus bar has a width size not larger in size than that of the disposing space and, therefore, can smoothly pass through the disposing space in the magnetic core.

Next, the magnetic core is further moved to dispose the bus bar to the bus bar insertion space in the magnetic core, so that the magnetic core is attached to the bus bar. Typically, the width size of the disposing space in the magnetic core is smaller in size than an inner diameter of the bus bar insertion space, so that the insertion portion of the bus bar can easily be moved to the bus bar insertion space in the magnetic core.

Therefore, in the present embodiment, the bus bar includes the insertion portion that can smoothly pass through the disposing space in the magnetic core, so that even if the bus bar increases in size as a whole, it is unnecessary to enlarge the bus bar insertion space in the magnetic core. As a result, according to the present embodiment, the magnetic core can be decreased in size, thereby miniaturizing the current detection device.

Further, according to the present embodiment, the bus bar, which has been used as a conductor conventionally, only needs to be machined, so that no conductor needs to be made of any other materials, thereby reducing the costs.

The present embodiment may have the following configuration.

The insertion portion may be a constricted portion having a width size not larger than that of the disposing space in the magnetic core and a length not less than the thickness size of the magnetic core, and the bus bar may include a wide portion which is wider than the constricted portion at a position adjacent to this constricted portion.

If the bus bar includes a portion having a smaller width size, the bus bar may possibly have a larger resistance value. However, according to the above configuration in which the wider portion (wide portion) is formed adjacent to the constricted portion, an increase in resistance value can be prevented.

The length of the constricted portion may be reduced to a minimum required to attach the magnetic core. This configuration is desirable in that the magnetic core can be attached and the bus bar can be securely prevented from having an increased value of resistance.

The invention claimed is:

1. An electric junction box comprising:
   a current detection device; and
   a bus bar, wherein:
   the current detection device includes a magneto-electric conversion element and a magnetic core, the magnetic core including a disposing space in which the magneto-electric conversion element is disposed,
   the current detection device is configured to detect magnetic flux occurring on the magnetic core as a current,
   the magnetic core has a bus bar insertion space through which the bus bar from which the current is to be detected is inserted,
   the bus bar includes an insertion portion that is to be inserted through the disposing space and is formed not larger in a first direction than a width in the first direction of the disposing space in the magnetic core,
   the bus bar includes a wide portion that is wider in the first direction than the insertion portion and that is adjacent to the insertion portion, and
   the wide portion is inserted into the bus bar insertion space.

2. The electric junction box according to claim 1, wherein:
   the insertion portion is a constricted portion having a width size in the first direction not larger than the width in the first direction of the disposing space in the magnetic core and having a length in a second direction orthogonal to the first direction not less than a thickness in the second direction of the magnetic core, and
   in a state that the wide portion is inserted into the bus bar insertion space, the constricted portion is disposed outside the disposing space.

3. The electric junction box according to claim 2, wherein the length of the constricted portion is set to a minimum required to attach the magnetic core thereto.

4. A current detection device comprising:
   a magneto-electric conversion element; and
   a magnetic core including a disposing space in which the magneto-electric conversion element is disposed, the current detection device detecting magnetic flux occurring on the magnetic core as a current, wherein:
   the magnetic core has a bus bar insertion portion through which a bus bar is inserted, and a current is detected from the bus bar, and the bus bar includes an insertion portion that is formed not larger in a first direction than a width in the first direction of the disposing space in the magnetic core and is to be inserted through the disposing space, the bus bar includes a wide portion that is wider in the first direction than the insertion portion and that is adjacent to the insertion portion, and the wide portion is inserted into the bus bar insertion space.

5. The current detection device according to claim 4, wherein:

the insertion portion is a constricted portion having a width in the first direction not larger than the width in the first direction of the disposing space in the magnetic core and a length in a second direction orthogonal to the first direction not less than a thickness in the second direction of the magnetic core, and in a state that the wide portion is inserted into the bus bar insertion space, the constricted portion is disposed outside the disposing space.

6. The current detection device according to claim 5, wherein the length of the constricted portion is set to a minimum required to attach the magnetic core thereto.

* * * * *